(12) United States Patent
Basu et al.

(10) Patent No.: US 12,087,870 B2
(45) Date of Patent: *Sep. 10, 2024

(54) INTEGRATED PHOTODETECTOR

(71) Applicant: Texas Instruments Incorporated, Dallas, TX (US)

(72) Inventors: Debarshi Basu, San Francisco, CA (US); Henry Litzmann Edwards, Garland, TX (US); Ricky A. Jackson, Richardson, TX (US); Marco A. Gardner, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 505 days.

This patent is subject to a terminal disclaimer.

(21) Appl. No.: 17/377,052

(22) Filed: Jul. 15, 2021

(65) Prior Publication Data

US 2021/0343884 A1 Nov. 4, 2021

Related U.S. Application Data

(60) Division of application No. 16/212,870, filed on Dec. 7, 2018, now Pat. No. 11,094,837, which is a
(Continued)

(51) Int. Cl.
*H01L 31/0232* (2014.01)
*G01J 1/02* (2006.01)
(Continued)

(52) U.S. Cl.
CPC .......... *H01L 31/02327* (2013.01); *G01J 1/02* (2013.01); *G01J 1/0209* (2013.01);
(Continued)

(58) Field of Classification Search
CPC ............. H01L 31/02327; H01L 25/167; H01L 31/103; G01J 1/02; G01J 1/0209; G01J 1/0411; G01J 1/42
See application file for complete search history.

(56) References Cited

U.S. PATENT DOCUMENTS

| 4,496,634 A | 1/1985 | Cline |
| 5,351,230 A * | 9/1994 | Takeda ................. G11B 7/1353 |
| | | 369/44.14 |

(Continued)

FOREIGN PATENT DOCUMENTS

| CN | 1894606 A | 1/2007 |
| CN | 101853869 A | 10/2010 |

(Continued)

OTHER PUBLICATIONS

International Search Report for PCT Application No. PCT/US17/16749, mailing date: May 18, 2017 (1 page).
(Continued)

*Primary Examiner* — Thanhha S Pham
(74) *Attorney, Agent, or Firm* — Valerie M. Davis; Frank D. Cimino

(57) ABSTRACT

An integrated circuit that includes a substrate, a photodiode, and a Fresnel structure. The photodiode is formed on the substrate, and it has a p-n junction. The Fresnel structure is formed above the photodiode, and it defines a focal zone that is positioned within a proximity of the p-n junction. In one aspect, the Fresnel structure may include a trench pattern that functions as a diffraction means for redirecting and concentrating incident photons to the focal zone. In another aspect, the Fresnel structure may include a wiring pattern that functions as a diffraction means for redirecting and concentrating incident photons to the focal zone. In yet another aspect, the Fresnel structure may include a transparent dielectric pattern that functions as a refractive means for redirecting and concentrating incident photons to the focal zone.

30 Claims, 9 Drawing Sheets

Related U.S. Application Data continuation of application No. 15/017,057, filed on Feb. 5, 2016, now Pat. No. 10,186,623.

(51) Int. Cl.

| | |
|---|---|
| *G01J 1/04* | (2006.01) |
| *G01J 1/42* | (2006.01) |
| *H01L 25/16* | (2023.01) |
| *H01L 31/103* | (2006.01) |

(52) U.S. Cl.
CPC ............... *G01J 1/0411* (2013.01); *G01J 1/42* (2013.01); *H01L 25/167* (2013.01); *H01L 31/103* (2013.01)

(56) References Cited

U.S. PATENT DOCUMENTS

| | | | | |
|---|---|---|---|---|
| 10,186,623 | B2 * | 1/2019 | Basu | ......................... G01J 1/02 |
| 11,094,837 | B2 * | 8/2021 | Basu | .................. H01L 31/02327 |
| 2005/0130409 | A1 | 6/2005 | Varghese | |
| 2006/0054986 | A1 | 3/2006 | Yu | |
| 2007/0278604 | A1 | 12/2007 | Minixhofer | |
| 2012/0132788 | A1 | 5/2012 | Findlay | |
| 2012/0132809 | A1 | 5/2012 | Findlay | |
| 2013/0093035 | A1 | 4/2013 | Fertig et al. | |
| 2015/0115383 | A1 | 4/2015 | Kokubun | |
| 2015/0228837 | A1 | 8/2015 | Chen et al. | |

FOREIGN PATENT DOCUMENTS

| | | |
|---|---|---|
| CN | 102538955 A | 7/2012 |
| CN | 105190892 A | 12/2015 |

OTHER PUBLICATIONS

Notification of Transmittal of the International Search Report and the Written Opinion of the International Searching Authority, or the Declaration; mailing date: May 18, 2017 (4 pages).

International Search Report for Application No. 2017800082639, date: Feb. 6, 2017 (12 pages), China.

* cited by examiner

INTEGRATED PHOTODETECTOR

CROSS REFERENCE TO RELATED APPLICATIONS

This divisional application claims priority to U.S. patent application Ser. No. 16/212,870, filed on Dec. 7, 2018, which application claims priority to U.S. patent application Ser. No. 15/017,057, filed on Feb. 5, 2016 (now U.S. Pat. No. 10,186,623), both of which are incorporated herein by reference in their entirety.

BACKGROUND

Photodetectors have many industrial and commercial applications. For example, photodetectors can be configured as proximity sensors, which are used in various consumer electronic products for sensing positions and motions of users. Depending on the sense range, the application of proximity sensors can be broadly classified into two categories: short-range proximity sensors and long-range proximity sensors. A short-range proximity sensor, for instance, can be used in a hand-held device, such as a smart phone, for activating and deactivating a touch screen to avoid inadvertent inputs during a phone call. On the other hand, a long-range proximity sensor can be used in a video gaming system, such as a motion sensor, for detecting the relative motions of a user while ignoring the background.

A photodetector may be fabricated in an integrated circuit along with other circuits. The performance of a photodetector may depend on its ability to convert incident photons to a sense signal. A convergent lens (e.g., a convex lens) can be used to focus the incident photons for enhancing the performance of a photodetector. However, conventional convergent lenses are generally too costly to be fabricated alongside with a photodetector in an integrated circuit. Moreover, the installation of conventional convergent lenses may be incompatible with the fabrication process of an integrated circuit. Therefore, there is a need for an integrated solution for manufacturing a low-cost and high-performance photodetector within an integrated circuit.

SUMMARY

The present disclosure describes systems and techniques relating to the manufacturing of an integrated photodetector. The disclosed integrated photodetector can be fabricated within an integrated circuit alongside with an optical device. The disclosed optical device is structured and configured to redirect incident electromagnetic (EM) waves within a proximity of a p-n junction of a photodiode. As energy from the incident EM waves is absorbed and converted into electron-hole pairs near the p-n junction, the minority carriers may travel more efficiently to avoid recombination. This allows the disclosed integrated photodetector to generate sense signals with higher amplitudes and thus better resolution.

In one implementation, for example, the present disclosure describes an integrated circuit that includes a substrate, a photodiode, and a Fresnel structure. The photodiode is formed on the substrate, and it has a p-n junction. The Fresnel structure is formed above the photodiode, and it defines a focal zone that is positioned within a proximity of the p-n junction. According to an aspect of the present disclosure, the Fresnel structure may include a trench pattern that functions as a diffraction means for redirecting and concentrating incident photons to the focal zone. According to another aspect of the present disclosure, the Fresnel structure may include a wiring pattern that functions as a diffraction means for redirecting and concentrating incident photons to the focal zone. According to yet another aspect of the present disclosure, the Fresnel structure may include a transparent dielectric pattern that functions as a refractive means for redirecting and concentrating incident photons to the focal zone.

In another implementation, for example, the present disclosure describes an integrated circuit that includes a substrate, a photodiode, and a diffractive structure. The photodiode is formed on the substrate, and it has a p-n junction. The diffractive structure is formed above the photodiode and beneath a top surface of the integrated circuit. The diffractive structure is positioned to direct an EM wave from the top surface to a focal zone within a proximity of the p-n junction. According to an aspect of the present disclosure, the diffractive structure may include a trench pattern that is configured to redirect and concentrate incident photons to the focal zone. According to another aspect of the present disclosure, the diffractive structure may include a wiring pattern that is configured to redirect and concentrate incident photons to the focal zone.

DRAWING DESCRIPTIONS

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

Figure 1A:
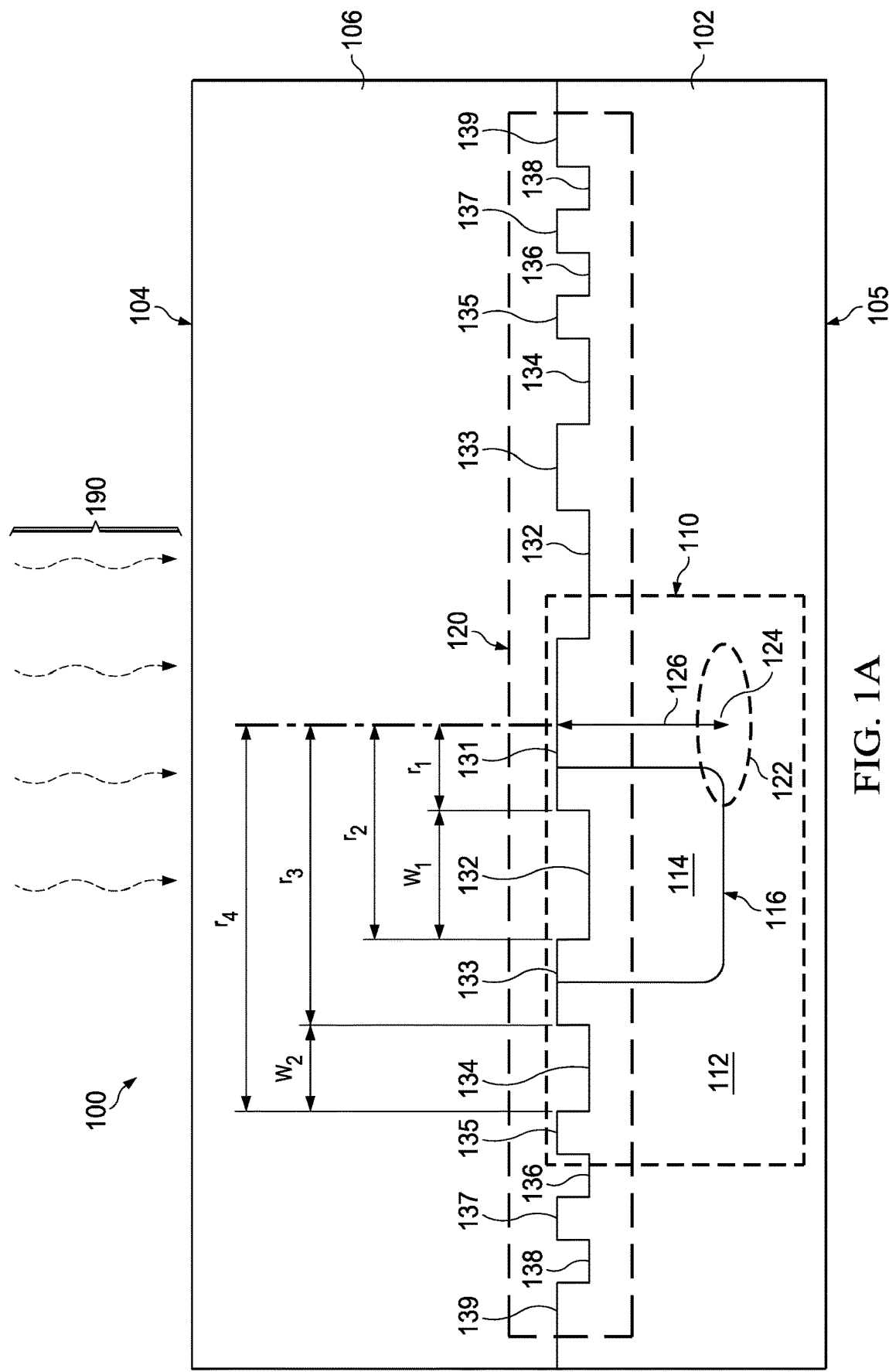
FIG. 1A shows a partial cross-sectional view of an exemplary integrated circuit according to an aspect of the present disclosure.
Figure 1B:
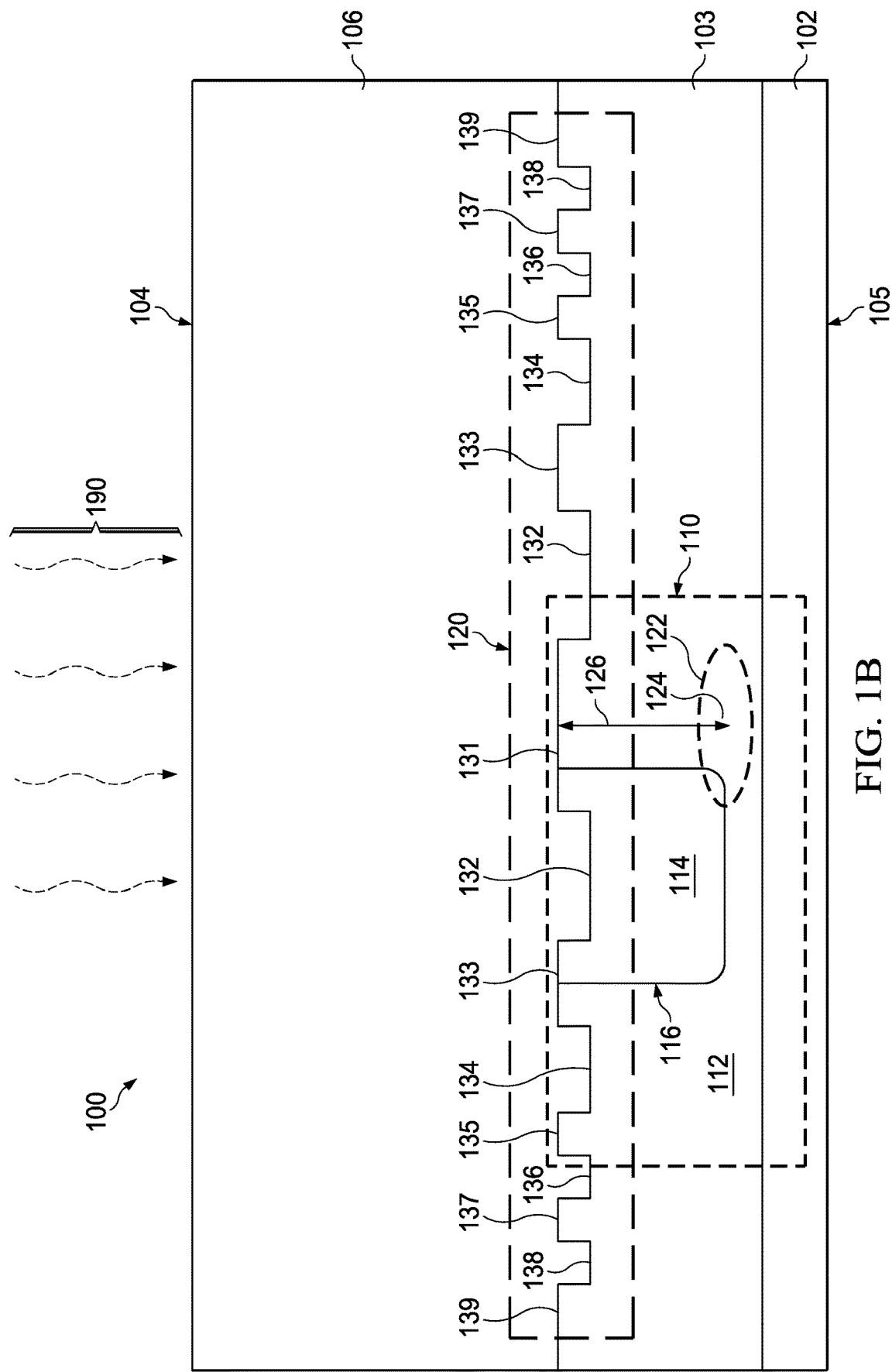
FIG. 1B shows a partial cross-sectional view of an exemplary integrated circuit according to another aspect of the present disclosure.

FIG. 1A shows a partial cross-sectional view of an exemplary integrated circuit 100 according to an aspect of the present disclosure. The integrated circuit 100 is fabricated within a single semiconductor die. The integrated circuit 100 is formed on a substrate 102. The substrate 102 can be a semiconductor substrate that includes a semiconducting material, such as silicon. The substrate 102 can be doped with p-type dopants. As shown in FIG. 1B, one or more epitaxial layers 103 can be grown directly on the substrate 102.

Figure 7:
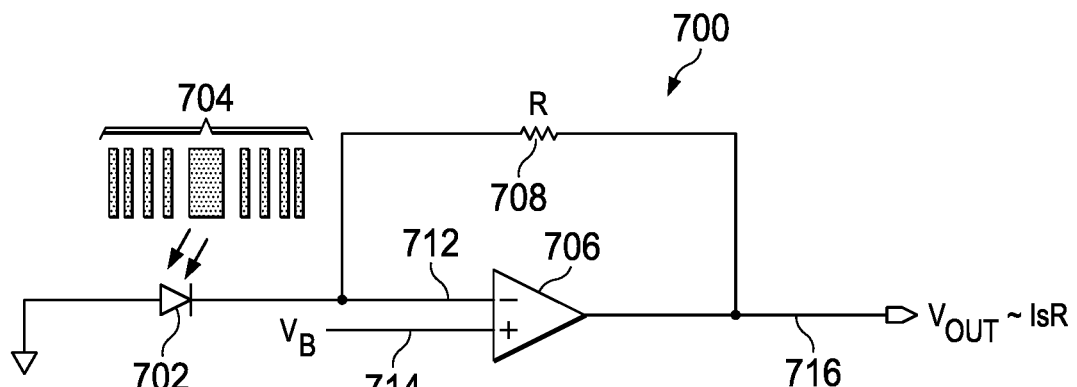
FIG. 7 shows a schematic view of an exemplary photodetector circuit according to an aspect of the present disclosure.

Referring to FIG. 7, the integrated circuit 100 includes a photodetector circuit 700, which is also formed on the substrate 102 and/or the epitaxial layer 103. The photodetector circuit 700 includes a photodiode 702, a Fresnel structure 704, an amplifier 706, and a feedback resistor 708. The Fresnel structure 704 is positioned above the photodiode 702 for redirecting electromagnetic (EM) waves to the proximity of a p-n junction of the photodiode 702. The anode of the photodiode 702 is coupled to a ground terminal, whereas the cathode of the photodiode 702 is coupled to a negative input electrode 712 of the amplifier 706. The amplifier 706 can be a trans-impedance amplifier being biased by a bias voltage ($V_B$) at its positive input electrode 714. The amplifier 706 is configured with a negative feedback loop, in which the feedback resistor 708 is coupled between the negative input electrode 712 and the output electrode 716 of the amplifier 706.

The photodiode 702 is configured in a reversed bias mode with its cathode regulated at a higher voltage (e.g., $V_B$) than its anode (e.g., $V_{GND}$). In the reversed bias mode, the photodiode 702 does not conduct any current. Upon receiving a sufficient amount of photons however, the photodiode 702 will convert the incident photons to electron-hole pairs. The majority carriers will stay within a local region, whereas minority carriers will travel across the p-n junction. For instance, the electrons generated at the p-doped region (i.e., anode) of the photodiode 702 will travel to the n-doped region (i.e., cathode) of the photodiode 702. As a result of the travelling minority carriers, the photodiode 702 generates a sense current ($I_S$) that immediately pulls down the potential at the negative input electrode 712. The amplifier 706 responds by increasing the potential at the output electrode 716. The increased potential at the output electrode 716 replenishes the charges drained at the negative input electrode 712 via the feedback resistor 708. In this manner, the photodetector circuit 700 generates an output voltage (e.g., $V_{OUT}$) as a function of the sense current ($I_S$) and the feedback resistance (R) of the feedback resistor 708. The Fresnel structure 704 allows more photons to be received and converted near the p-n junction of the photodiode 702, thereby enhancing the amplitude the sense current ($I_S$). As such, the enhanced sense current ($I_S$) improves the sensitivity of the output voltage ($V_{OUT}$).

Referring again to FIG. 1A, a photodiode 110 can be formed in the substrate 102, and it can implement the functions of the photodiode 702 as described in FIG. 7. The photodiode 110 includes an p-doped region 112, an n-doped region 114, and a p-n junction 116 abutting between the p-doped region 112 and the n-doped region. Both the p-doped region 112 and the n-doped region 114 can be formed by implantations within the substrate 102 or within the epitaxial layer 103 as shown in FIG. 1B. The p-doped region 112 is a part of the anode of the photodiode 110, whereas the n-doped region 114 is a part of the cathode of the photodiode 110. Although FIG. 1A shows that the photodiode 110 includes only one p-doped region 112 and one n-doped region 114, the photodiode 110 may be formed by multiple p-doped and n-doped regions.

In one implementation, for example, the photodiode 110 can be formed by a complementary metal-oxide semiconductor (CMOS) device (e.g., NMOS or PMOS). In another implementation, for example, the photodiode 110 can be formed by a bipolar junction transistor (BJT) device. In yet another implementation, for example, the photodiode 110 can be formed by a silicon on insulator (SOI) device. Depending on the type of devices by which the photodiode 110 is formed, the p-n junction 116 may be a vertical junction, a horizontal junction, or a combination of both.

Figure 1C:
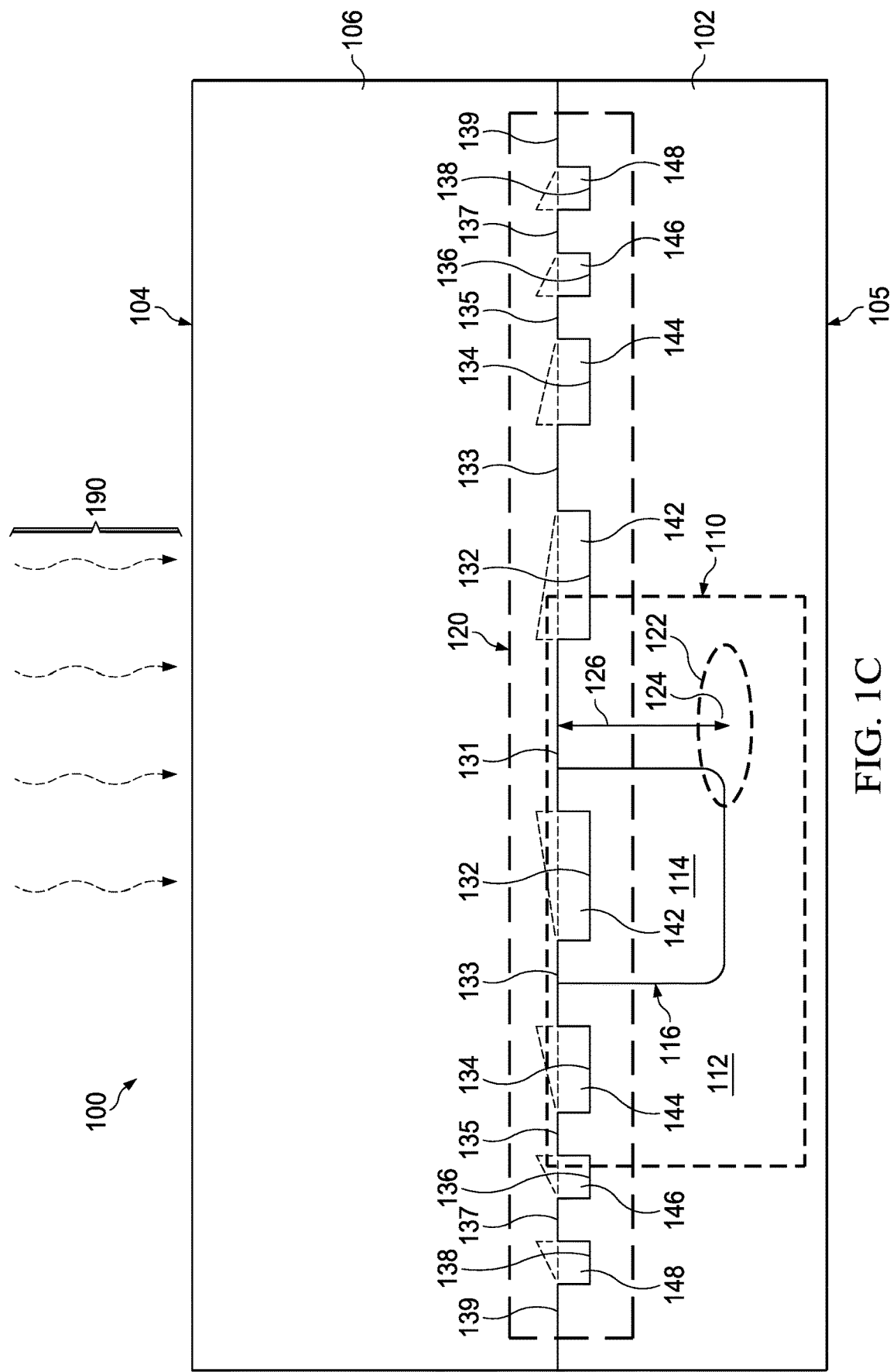
FIG. 1C shows a partial cross-sectional view of an exemplary integrated circuit according to another aspect of the present disclosure.

The integrated circuit 100 includes a top surface 104 and a bottom surface 105 opposing the top surface 104. The substrate 102 generally forms the bottom surface 105, whereas one or more dielectric layers 106 form the top surface. The dielectric layer 106 may be transparent, or semi-transparent, which allows EM waves 190 to traverse from the top surface 104 to the photodiode 110. The integrated circuit 100 incorporates within its process flow a Fresnel structure 120 for redirecting and focusing the incident EM waves 190. The Fresnel structure 120 can implement the functions of the Fresnel structure 704 as described in FIG. 7. The Fresnel structure 120 is positioned between the top surface 104 and the p-n junction 116 of the photodiode 110. Though FIGS. 1A-1C show the Fresnel structure 120 being positioned above the photodiode 110, the Fresnel structure 120 can be formed as a part of the photodiode 110 as well.

The Fresnel structure 120 defines a focal zone 122 that surrounds a focal point 124 to which the incident EM waves are redirected and concentrated. The focal point 124 generally rests within the focal zone 122. The location of the focal point 124 may vary depending on the wavelengths of the EM waves 190. The focal zone 122 is positioned within a proximity of the p-n junction 116. According to an aspect of the present disclosure, the proximity of the p-n junction 116 can be understood as a distance that is within an order of wavelength(s) of a target EM wave. In one implementation, for example, the proximity of the p-n junction 116 can be within a radial distance of a half wavelength from the p-n junction 116. In another implementation, for example, the proximity of the p-n junction 116 can be within a radial distance of one wavelength from the p-n junction 116. In yet another implementation, for example, the proximity of the p-n junction 116 can be within a radial distance of two wavelengths from the p-n junction 116.

According to another aspect of the present disclosure, the proximity of the p-n junction 116 may depend on the penetrating power of the incident EM waves 190. In general, EM waves with greater wavelengths penetrate deeper into the substrate 102 (or the epitaxial layer 103 as shown in FIG. 1B). Thus, the proximity of the p-n junction 116 may also be understood as a vertical distance descending from the Fresnel structure 120. In one implementation, for example, the proximity of the p-n junction 116 can be within a vertical distance of 1 um where the incident EM waves 190 include ultraviolet waves. In another implementation, for example, the proximity of the p-n junction 116 can be within a vertical distance of 10 um where the incident EM waves 190 include visible light waves. In yet another implementation, for example, the proximity of the p-n junction 116 can be within a vertical distance of 30 um where the incident EM waves 190 include near infrared (NIR) waves.

The Fresnel structure 120 includes a central region 131 that is positioned directly above a section of the p-n junction 116. The Fresnel structure 120 also includes an array of slits that are arranged outward from the central region 131. In the implementation as shown in FIGS. 1A-1C, the slits are defined by a trench pattern etched into the surface of the substrate 102 (or the epitaxial layer 103 as shown in FIG. 1B). Thus, the cost and complexity of fabricating the Fresnel structure 120 are relatively low when compared to the conventional convergent lenses.

The trench pattern serves as a diffractive structure (e.g., a diffraction grating) for diffracting EM waves 190 such that the diffracted EM waves 190 is concentrated within the focal zone 122. In one implementation, the trench pattern includes a first trench 132, a second trench 134, a third trench 136, and a fourth trench 138 on each side of the central region 131. Each of the first, second, third, and fourth trenches 132, 134, 136, and 138 is adjacent to and laterally surrounds the central region 131. Moreover, each of the first, second, third, and fourth trenches 132, 134, 136, and 138 is arranged symmetrically along the center region 131, thereby forming a pair of symmetrical slits above the photodiode 110.

The trench pattern also includes an array of moat regions separating the aforementioned trenches. For instance, the first and second trenches 132 and 134 are separated by a first moat region 133, the second and third trenches 134 and 136 are separated by a second moat region 135, and the third and fourth trenches 136 and 138 are separated by a third moat region 137. The outmost trench (e.g., the fourth trench 138) is surrounded by an outmost moat region (e.g., the fourth moat region 139). The central region 131 may include a central moat region as shown in FIGS. 1A-1C in one aspect. And in another aspect, the central moat region may further define a central trench (not shown), which can serve as a center slit (not shown). These moat regions (e.g., 131, 133, 135, 137, and 139) serve as a means for blocking out-of-phase EM waves 190, whereas the slits defined by the trenches (e.g., 132, 134, 136, and 138) serves as a means for passing in-phase EM waves 190. Together, the trenches and the moat regions diffract the incident EM waves 190 to have constructive interferences within the focal zone 122.

The trenches (e.g., 132, 134, 136, and 138) can be formed during a shallow trench isolation process, which is a part of the process flow for fabricating the integrated circuit 100. The moat regions (e.g., 131, 133, 135, 137, and 139) can be used for forming one or more circuits for interfacing with the photodiode 110. For instance, the moat regions can be used for forming the amplifier 706 as described in FIG. 7. To isolate a circuit formed on one moat region (e.g., 133) from another circuit formed on another moat region (e.g., 135), a field oxide material can be deposited in the trench (e.g., 134) to separate these two moat regions.

According to an aspect of the present disclosure, the field oxide material can form one or more refractive structures for enhancing the performance of the diffractive structure as described in FIGS. 1A and 1B. Referring to FIG. 1C, for example, the Fresnel structure 120 may further include a refractive structure that is configured to refract the incident EM waves 190 to be concentrated within the focal zone 122. In one implementation, the refractive structure includes a patterned transparent dielectric (TD) blocks, such as a first TD block 142, a second TD block 144, a third TD block 146, and a fourth TD block 148. The first, second, third, and fourth TD blocks 142, 144, 146, and 148 are respectively deposited into, and thereby occupying, the first, second, third, and fourth trenches 132, 134, 136, and 138. Thus, each of the first, second, third, and fourth TD blocks 142, 144, 146, and 148 is adjacent to and laterally surrounds the central region 131. Moreover, each of the first, second, third, and fourth TD blocks 142, 144, 146, and 148 is arranged symmetrically along the center region 131, thereby forming a pair of symmetrical slits above the photodiode 110.

The transparent dielectric material can be a transparent oxide material, such as silicon oxide, or any other transparent dielectric material used during the fabrication process of the integrated circuit 100. In one implementation, each of the first, second, third, and fourth TD blocks 142, 144, 146, and 148 may have a relatively flat top surface that is substantially coplanar with the top surface of the substrate 102 (or the epitaxial layer 103 as shown in FIG. 1B). In another implementation, each of the first, second, third, and fourth TD blocks 142, 144, 146, and 148 may have a top surface that is slightly sloped away from the central region 131 to enhance the overall refractive power of the refractive structure. As such, each of first, second, third, and fourth TD blocks 142, 144, 146, and 148 may have a near side wall, which is closer to the central region 131, and a far side wall, which is farther away from the central region 131. The near side walls may be deposited with more transparent dielectric material such that the near side walls are generally higher than the respective far side walls.

Figure 1D:
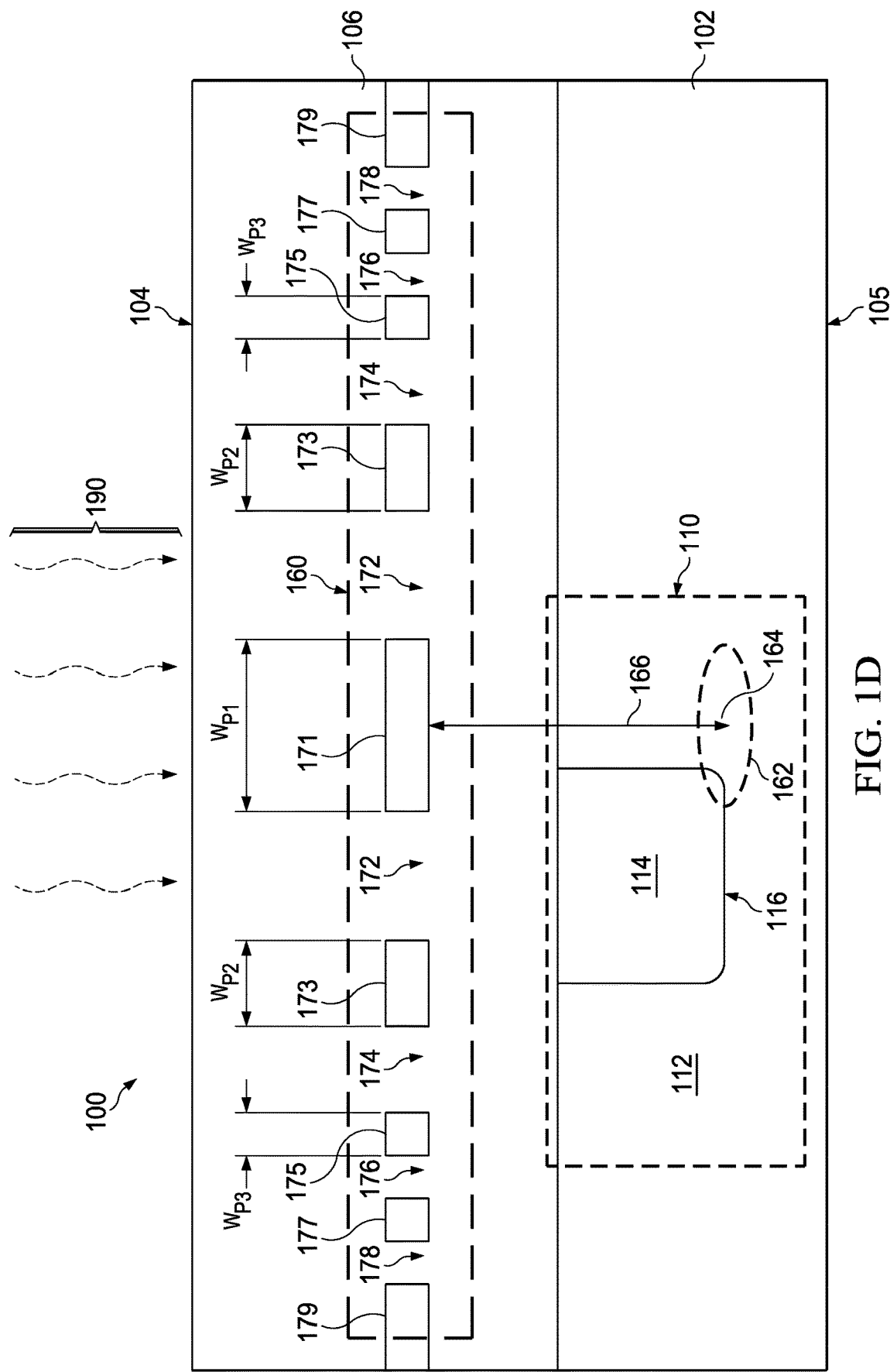
FIG. 1D shows a partial cross-sectional view of an exemplary integrated circuit according to another aspect of the present disclosure.

FIGS. 1A-1C illustrates that the Fresnel structure 120 can be formed on the substrate 102 or on the epitaxial layer 103 above the substrate 102. According to an additional aspect of the present disclosure, a Fresnel structure may also be formed on one or more conductive wiring layers, which are positioned above the substrate (e.g., 102) and the epitaxial layer (e.g., 103). Referring to FIG. 1D, for example, a Fresnel structure 160 can be formed in one or more conductive wiring layers above the substrate 102. The wiring layers may include but is not limited to a polysilicon layer that formed on the moat regions (e.g., 121, 133, 135, 137, and 139 as shown in FIGS. 1A-1C) and/or an interconnect metal layer that formed on a dielectric layer (e.g., 106). Similar to the Fresnel structure 120, the Fresnel structure 160 is configured to redirect and focus the incident EM waves 190, and it can also implement the functions of the Fresnel structure 704 as described in FIG. 7.

The Fresnel structure 160 is positioned between the top surface 104 of the integrated circuit 100 and the p-n junction 116 of the photodiode 110. The Fresnel structure 160 defines a focal zone 162 that surrounds a focal point 164 to which the incident EM waves are redirected. The location of the focal point 164 may vary depending on the wavelengths of the EM waves. Regardless, the focal point 164 generally rests within the focal zone 162. Because the Fresnel structure 160 is positioned farther away from the photodiode 110 than the Fresnel structure 120, the focal length 166 of the Fresnel structure 160 is generally greater that the focal length 126 of the Fresnel structure 120 (see, e.g., FIG. 1A). The focal zone 162 is positioned within a proximity of the p-n junction 116. According to an aspect of the present disclosure, the proximity of the p-n junction 116 can be understood as a distance that is within an order of wavelength(s) of the target EM wave. In one implementation, for example, the proximity of the p-n junction 116 can be within a radial distance of a half wavelength from the p-n junction 116. In another implementation, for example, the proximity of the p-n junction 116 can be within a radial distance of one wavelength from the p-n junction 116. In yet another implementation, for example, the proximity of the p-n junction 116 can be within a radial distance of two wavelengths from the p-n junction 116.

According to another aspect of the present disclosure, the proximity of the p-n junction 116 may depend on the penetrating power of the incident EM waves 190. EM waves 190 with greater wavelengths generally penetrate deeper into the substrate 102 (or the epitaxial layer 103 as shown in FIG. 1B). Thus, the proximity of the p-n junction 116 may also be understood as a vertical distance descending from the Fresnel structure 160. In one implementation, for example, the proximity of the p-n junction 116 can be within a vertical distance of 1 um where the target EM waves 190 include ultraviolet waves. In another implementation, for example, the proximity of the p-n junction 116 can be within a vertical distance of 10 um where the target EM waves 190 include visible light waves. In yet another implementation, for example, the proximity of the p-n junction 116 can be within a vertical distance of 30 um where the target EM waves 190 include near infrared (NIR) waves.

The Fresnel structure 160 includes a central region 171 that is positioned directly above a section of the p-n junction 116. The Fresnel structure 160 also includes an array of slits (i.e., 162, 164, 166, and 168) that are arranged outward from the central region 171. In the implementation, the slits are defined by a zone plate pattern within one or more interconnect wiring layers. Thus, the cost and complexity of fabricating the Fresnel structure 160 are relatively low when compared to the conventional convergent lenses.

The wiring pattern serves as a diffractive structure (e.g., a diffraction grating) for diffracting EM waves 190 such that the diffracted EM waves 190 is concentrated within the focal zone 162. The wiring pattern includes an array of zone plates to form a diffraction grating. In one implementation, for instance, the wiring pattern includes a central zone plate at the central region 171, a first zone plate 173, a second zone plate 175, a third zone plate 177, and a fourth zone plate 179. These zone plates (e.g., 171, 173, 175, 177, and 179) serve as a means for blocking out-of-phase EM waves 190. Moreover, these zone plates (e.g., 171, 173, 175, 177, and 179) define an array of slits that serve as a means for passing in-phase EM waves 190. In one implementation, for example, the zone plate grating defines a first slit 172, a second slit 174, a third slit 176, and a fourth slit 178. These slits are defined on both sides of the central region 171. Each of the first, second, third, and fourth slits 172, 174, 176, and 178 is adjacent to and laterally surrounds the central region 171. Moreover, each of the first, second, third, and fourth slits 172, 174, 176, and 178 is arranged symmetrically along the center region 171, thereby forming a pair of symmetrical slits above the photodiode 110. Together, the trenches and the moat regions diffract the incident EM waves 190 to have constructive interferences within the focal zone 162.

The zone plates (e.g., 171, 173, 175, 177, and 179) and the slits (e.g., 172, 174, 176, and 178) can be formed during one or more wiring deposition processes (e.g., polysilicon deposition and/or metal deposition). Thus, the formation of the zone plates and the slits can be achieved within the fabrication process flow of the integrated circuit 100. In an implementation where the zone plates (e.g., 171, 173, 175, 177, and 179) are formed in a polysilicon wiring layer, the zone plates can be positioned directly on or above the moat regions (e.g., 131, 133, 135, 137, and 139 as shown in FIGS. 1A-1C). Thus, each of the zone plates may align and overlap with a particular moat region to increase the vertical dimension of each slit. In this particular implementation, the Fresnel structure 120 is combined with the Fresnel structure 160 to form an array of slits, each of which includes a pair of elongated side walls defined by a corresponding trench (e.g., 132, 134, 136, or 138) and a pair of zone plates (e.g., 171, 173, 175, 177, and/or 179).

The zone plates (e.g., 171, 173, 175, 177, and 179) may be formed in a metal wiring layer above a polysilicon wiring layer as well. In an implementation where the Fresnel structure 120 is included, the zone plates can be positioned above the photodiode 110 without blocking the incident EM waves 190 from the Fresnel structure 120. In this particular implementation, the zone plates (e.g., 171, 173, 175, 177, and 179) are arranged farther away from the central regions 171 than the trenches (e.g., 132, 134, 136, or 138) are arranged from the central regions 131 in order to leave the vertical region above the trenches substantially unobstructed. Alternatively, in an implementation where the Fresnel structure 120 is not included, the zone plates (e.g., 171, 173, 175, 177, and 179) can be positioned closer to the central region 171. For instance, the zone plates (e.g., 171, 173, 175, 177, and 179) can be positioned directly above a location where the moat regions (e.g., 131, 133, 135, 137, and 139) are supposed to form should they be included.

Figure 2:
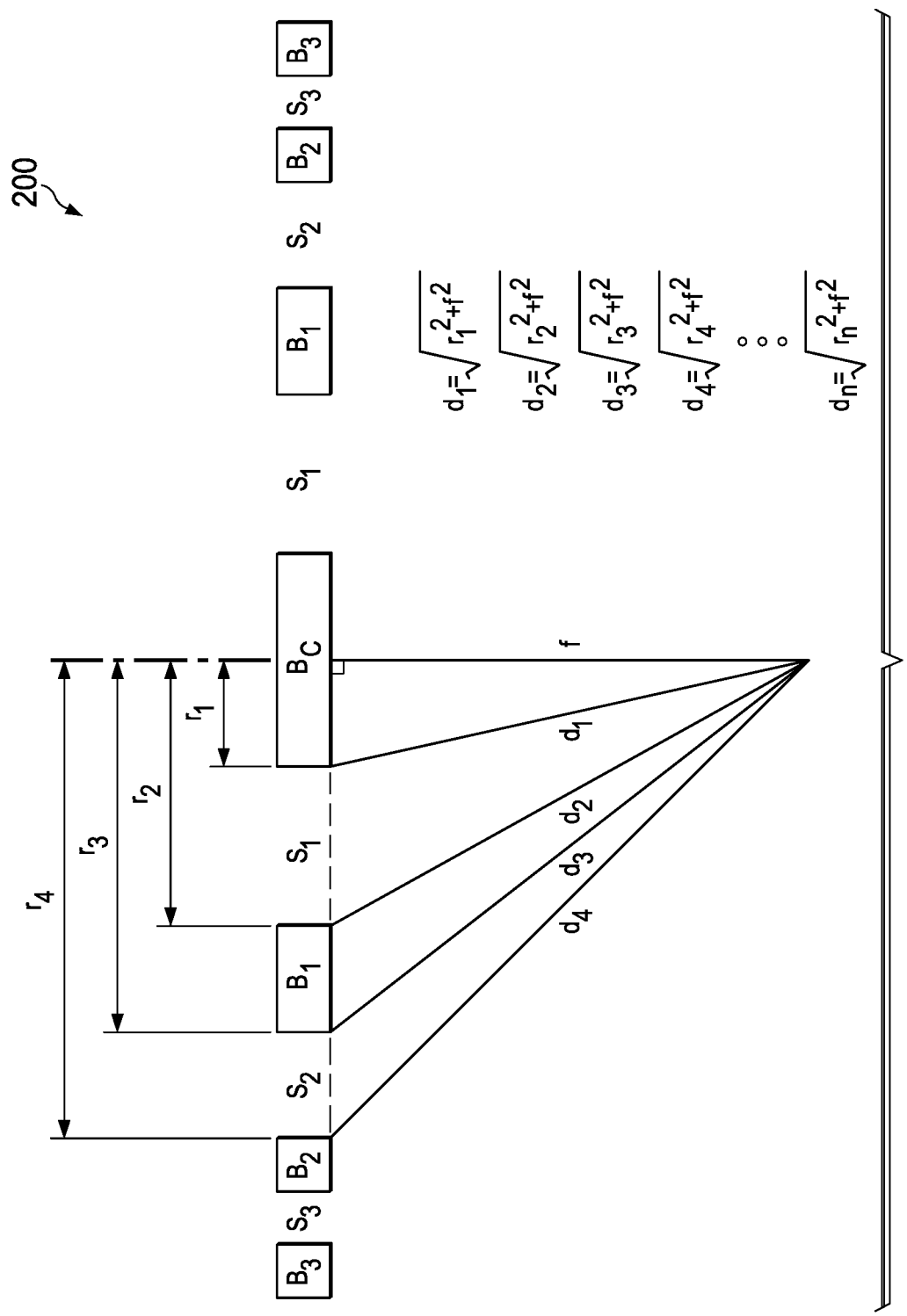
FIG. 2 shows a perspective view of an exemplary Fresnel structure according to an aspect of the present disclosure.

FIG. 2 shows a perspective view of an exemplary Fresnel structure 200 according to an aspect of the present disclosure. The Fresnel structure 200 serves as a model for the Fresnel structure 120 and the Fresnel structure 160. In particular, the Fresnel structure 200 helps illustrate the respective dimensions of the grating pattern of the Fresnel structures 120 and 160. The Fresnel structure 200 includes a symmetrically arranged bar pattern, which define a symmetrically arranged slit pattern. The bar pattern includes a central bar $B_C$, a pair of first side bars $B_1$, a pair of second side bars $B_2$, and a pair of third side bars $B_3$. The slit pattern includes a pair of first slits $S_1$, a pair of second slits $S_2$, and a pair of third slits $S_3$.

The bar pattern serves a model for the moat regions (e.g., 131, 133, 135, and 137) of the Fresnel structure 120, and as a model for the zone plates (e.g., 171, 173, 175, and 177) of the Fresnel structure 160. Similarly, the slit pattern serves a model for the trenches (e.g., 132, 134, and 136) of the Fresnel structure 120, and as a model for the slits (e.g., 172, 174, and 176) of the Fresnel structure 160. Thus, the radial distances ($r_1$, $r_2$, $r_3$, and $r_4$) as shown in FIG. 2 corresponds to the radial distances ($r_1$, $r_2$, $r_3$, and $r_4$) as shown in FIGS. 1A-1C. Moreover, the trench widths (e.g., $W_1$ and $W_2$) as shown in FIGS. 1A-1C are modeled by the slits (e.g., $S_1$ and $S_2$) in FIG. 2, whereas the plate widths (e.g., $W_{P1}$, $W_{P2}$, and $W_{P3}$) as shown in FIG. 1D are modeled by the bars (e.g., $B_C$, $B_1$, and $B_2$). Furthermore, the focal length (f) represents a model of the focal length 126 of the Fresnel structure 120 and the focal length 166 of the Fresnel structure 160.

The respective widths of the bars and the slits can be expressed as a function of the radial distance. For example, the width of the central bar $B_C$ is defined by two times of the first radial distance $r_1$. For another example, The width of the first slit $S_1$ is defined by a difference between the second radial distance $r_2$ and the first radial distance $r_1$. For yet another example, the width of the first side bar $B_1$ is defined by a difference between the third radial distance $r_3$ and the second radial distance $r_2$. And similarly, the width of the second slit $S_2$ is defined by a difference between the fourth radial distance $r_4$ and the third radial distance $r_3$. From here, it can be derived that the width of the $n^{th}$ side bar $B_n$ is defined by a difference between the $(2n+1)^{th}$ radial distance $r_{(2n+1)}$ and the $2n^{th}$ radial distance $r_{(2n)}$, whereas the width of the $n^{th}$ slit $S_n$ is defined by a difference between the $(2n)^{th}$ radial distance $r_{(2n)}$ and the $(2n-1)^{th}$ radial distance $r_{(2n-1)}$.

To achieve constructive interferences within the focal zone (e.g., the focal zone 122 or the focal zone 162), the diffractive distances (e.g., $d_n$) and the focal length (f) may be separated by an order of a half-wavelength (i.e., $\lambda/2$). As such, the $n^{th}$ diffractive distance ($d_n$) can be expressed by Equation (1) below:

$$d_n = f + \frac{n*\lambda}{2} \qquad \text{Eq. (1)}$$

Moreover, the first diffractive distance ($d_1$) may be associated with the first radial distance ($r_1$) by an integer multiplier of 1. The first diffractive distance ($d_1$) and the first radial distance ($r_1$) may join the focal length (f) to form a first right-angle triangle. Under this trigonometric principle, the $n^{th}$ diffractive distance ($d_0$) may be associated with the $n^{th}$ radial distance ($r_n$) by an integer multiplier of n to form the $n^{th}$ right-angle triangle with the focal length (f). To solve for a particular radial distance $r_n$, one may apply the Pythagoras Theorem as expressed in Equations (2.1) and (2.2) below:

$$r_n^2 = \left(f + \frac{n*\lambda}{2}\right)^2 - f^2 \qquad \text{Eq. (2.1)}$$

$$r_n = \sqrt{n*\lambda*f + \frac{n^2\lambda^2}{4}} \qquad \text{Eq. (2.2)}$$

Assuming the wavelength ($\lambda$) of the incident EM waves 190 is substantially smaller than the focal length (f), the particular radial distance $r_n$ may be approximated by Equation (3):

$$r_n \approx \sqrt{n*\lambda*f}. \qquad \text{Eq. (3)}$$

Accordingly, the radial distance of the $n^{th}$ order can be determined based upon the focal length (f) as defined by the respective focal zone (e.g., 122 and 162), an integer multiplier (n) associated with the $n^{th}$ order, and the wavelength ($\lambda$) of the EM wave to be detected. Because the focal zone (e.g., 122) is located within a proximity of the p-n junction (e.g., 116) of the photodiode (e.g., 110), the diffusion distance of the minority carriers may be reduced by integrating a photodiode with the Fresnel structure (e.g., 120 and/or 160) according to one or more aspects of the present disclosure. And because the diffusion distance dictates the frequency response of the photodetector (e.g., 700), the disclosed Fresnel structure (e.g., 120 and/or 160) may significantly enhance the performance of a photodetector. In one implementation, for example, the frequency response of a photodetector can be improved from 100 kHz to 10 MHz by incorporating the disclosed Fresnel structure (e.g., 120 and/or 160).

The integrated Fresnel structures (e.g., 120 and 160) as described above may adopt various planar pattern. For example, FIGS. 3-6 below show several of these planar patterns, each of which can be adopted to form the cross-sectional configurations of the Fresnel structure as shown in FIGS. 1A-1D.

Figure 3:
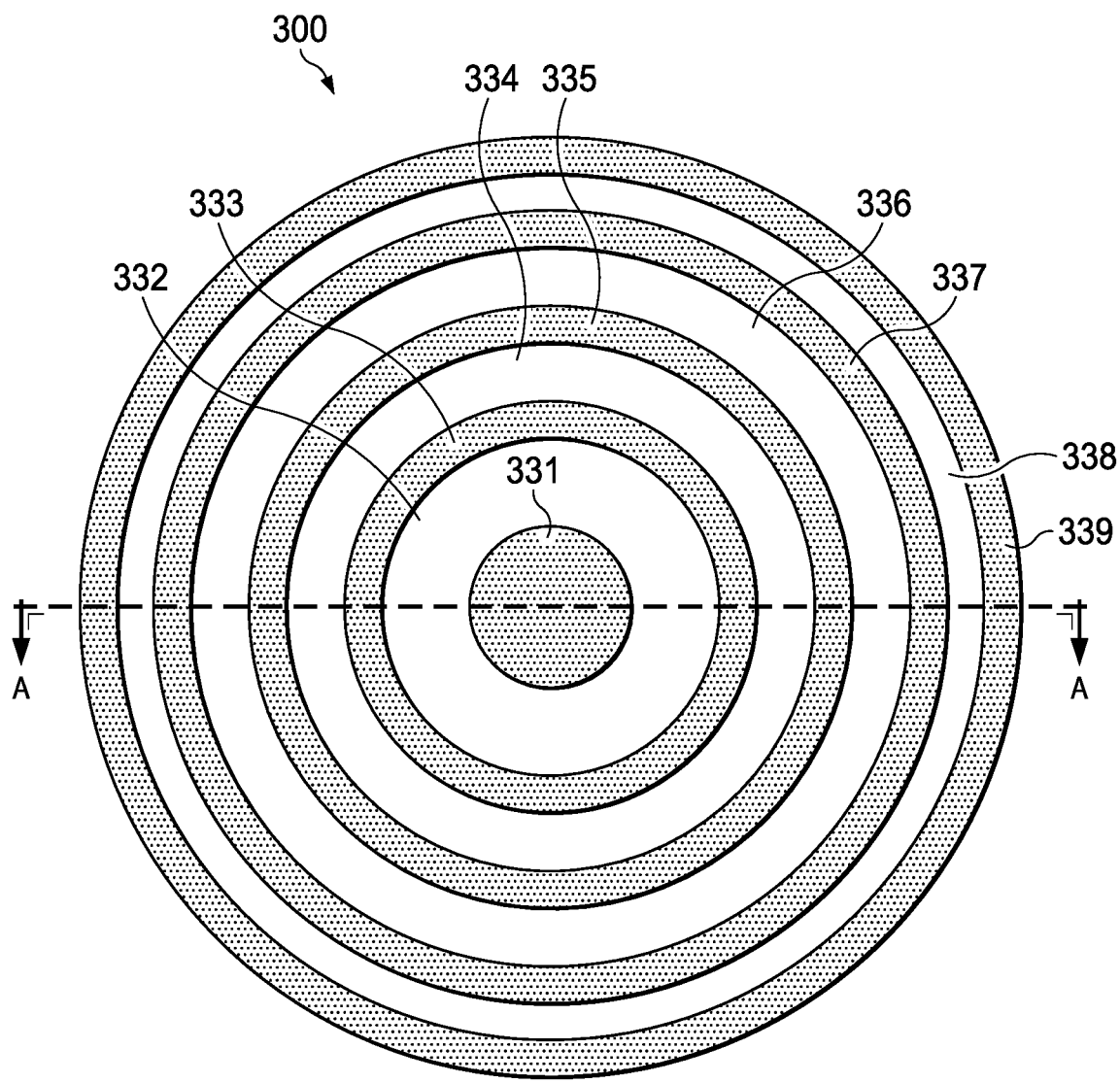
FIG. 3 shows a top view of an exemplary Fresnel structure with a circular ring pattern according to an aspect of the present disclosure.

FIG. 3 shows a top view of an exemplary Fresnel structure with a circular ring pattern 300 according to an aspect of the present disclosure. The circular ring pattern 300 is parallel to a top surface of the integrated circuit substrate (e.g., 102). The circular ring pattern 300 includes: a circular center plate 331 overlaps with the central region (e.g., 131 and 171) of the Fresnel structure; a first circular ring plate 331 surrounding the circular center plate 331; a second circular ring plate 333 concentric with the first circular ring plate 331; a third circular ring plate 335 concentric with the second circular ring plate 333; a fourth circular ring plate 337 concentric with the third circular ring plate 335; and a fifth circular ring plate 339 concentric with the fourth circular ring plate 337.

Together, the circular center plate 331 and the circular ring plates 333, 335, 337, and 339 define several circular ring slits, including: a first circular ring slit 332 defined between the circular center plate 331 and the first circular ring plate 333; a second circular ring slit 334 defined between the second circular ring plate 333 and the second circular ring plate 335; a third circular ring slit 336 defined between the third circular ring plate 335 and the fourth circular ring plate 337; and a fourth circular ring slit 338 defined between the fourth circular ring plate 337 and the fifth circular ring plate 339.

According to an aspect of the present disclosure, the cross-section A of the circular ring pattern 300 can be viewed as the cross-sectional view of the Fresnel structure 120 as shown and described in FIGS. 1A-1C. Thus, the circular ring slits 332, 334, 336, and 338 may correspond to the trenches 132, 134, 136, and 138 respectively. To that end, each of the trenches 132, 134, 136, and 138 is a circular ring trench adopting the planar configuration of the circular ring pattern 300. Moreover, the circular ring plates 333, 335, 337, and 339 may correspond to the moat regions 133, 135, 137, and 139 respectively. To that end, each of the moat regions 133, 135, 137, and 139 is a circular moat ring adopting the planar configuration of the circular ring pattern 300.

According to another aspect of the present disclosure, the cross-section A of the circular ring pattern 300 can be viewed as the cross-sectional view of the Fresnel structure 160 as shown and described in FIG. 1D. Thus, the circular ring slits 332, 334, 336, and 338 may correspond to the slits 172, 174, 176, and 178 respectively. To that end, each of the slits 172, 174, 176, and 178 is a circular ring slit adopting the planar configuration of the circular ring pattern 300. Moreover, the circular ring plates 333, 335, 337, and 339 may correspond to the zone plates 173, 175, 177, and 179 respectively. To that end, each of the zone plates 173, 175, 177, and 179 is a circular ring plate adopting the planar configuration of the circular ring pattern 300.

Figure 4:
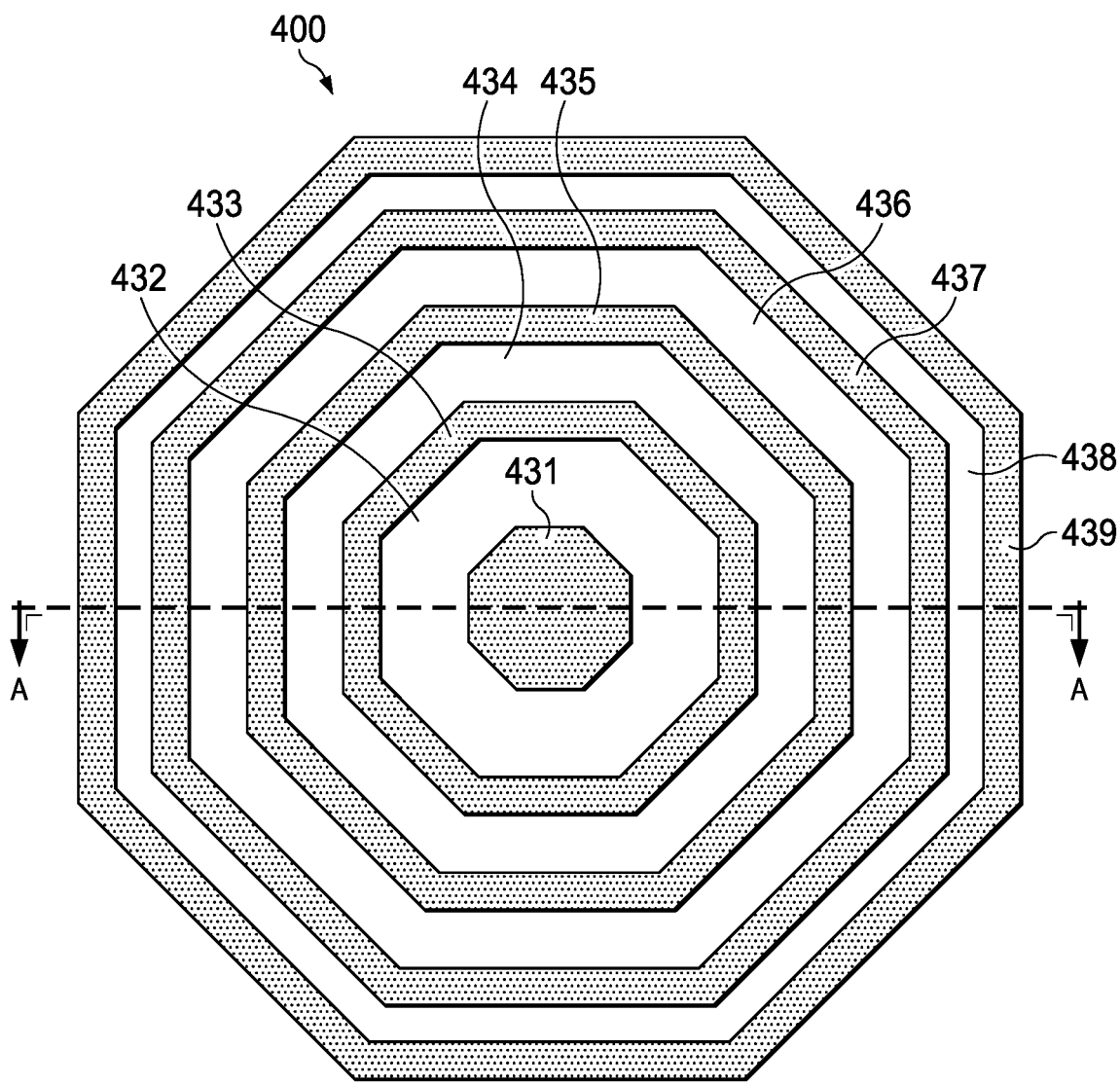
FIG. 4 shows a top view of an exemplary Fresnel structure with an octagonal ring pattern according to an aspect of the present disclosure.

FIG. 4 shows a top view of an exemplary Fresnel structure with an octagonal ring pattern 400 according to an aspect of the present disclosure. The octagonal ring pattern 400 is parallel to a top surface of the integrated circuit substrate (e.g., 102). The octagonal ring pattern 400 includes: an octagonal center plate 431 overlaps with the central region (e.g., 131 and 171) of the Fresnel structure; a first octagonal ring plate 431 surrounding the octagonal center plate 431; a second octagonal ring plate 433 concentric with the first octagonal ring plate 431; a third octagonal ring plate 435 concentric with the second octagonal ring plate 433; a fourth octagonal ring plate 437 concentric with the third octagonal ring plate 435; and a fifth octagonal ring plate 439 concentric with the fourth octagonal ring plate 437.

Together, the octagonal center plate 431 and the octagonal ring plates 433, 435, 437, and 439 define several octagonal ring slits, including: a first octagonal ring slit 432 defined between the octagonal center plate 431 and the first octagonal ring plate 433; a second octagonal ring slit 434 defined between the second octagonal ring plate 433 and the second octagonal ring plate 435; a third octagonal ring slit 436 defined between the third octagonal ring plate 435 and the fourth octagonal ring plate 437; and a fourth octagonal ring slit 438 defined between the fourth octagonal ring plate 437 and the fifth octagonal ring plate 439.

According to an aspect of the present disclosure, the cross-section A of the octagonal ring pattern 400 can be viewed as the cross-sectional view of the Fresnel structure 120 as shown and described in FIGS. 1A-1C. Thus, the octagonal ring slits 432, 434, 436, and 438 may correspond to the trenches 132, 134, 136, and 138 respectively. To that end, each of the trenches 132, 134, 136, and 138 is an octagonal ring trench adopting the planar configuration of the octagonal ring pattern 400. Moreover, the octagonal ring plates 433, 435, 437, and 439 may correspond to the moat regions 143, 135, 137, and 139 respectively. To that end, each of the moat regions 143, 135, 137, and 139 is an octagonal moat ring adopting the planar configuration of the octagonal ring pattern 400.

According to another aspect of the present disclosure, the cross-section A of the octagonal ring pattern 400 can be viewed as the cross-sectional view of the Fresnel structure 160 as shown and described in FIG. 1D. Thus, the octagonal ring slits 432, 434, 436, and 438 may correspond to the slits 172, 174, 176, and 178 respectively. To that end, each of the slits 172, 174, 176, and 178 is an octagonal ring slit adopting the planar configuration of the octagonal ring pattern 400. Moreover, the octagonal ring plates 433, 435, 437, and 439 may correspond to the zone plates 173, 175, 177, and 179 respectively. To that end, each of the zone plates 173, 175, 177, and 179 is an octagonal ring plate adopting the planar configuration of the octagonal ring pattern 400.

Figure 5:
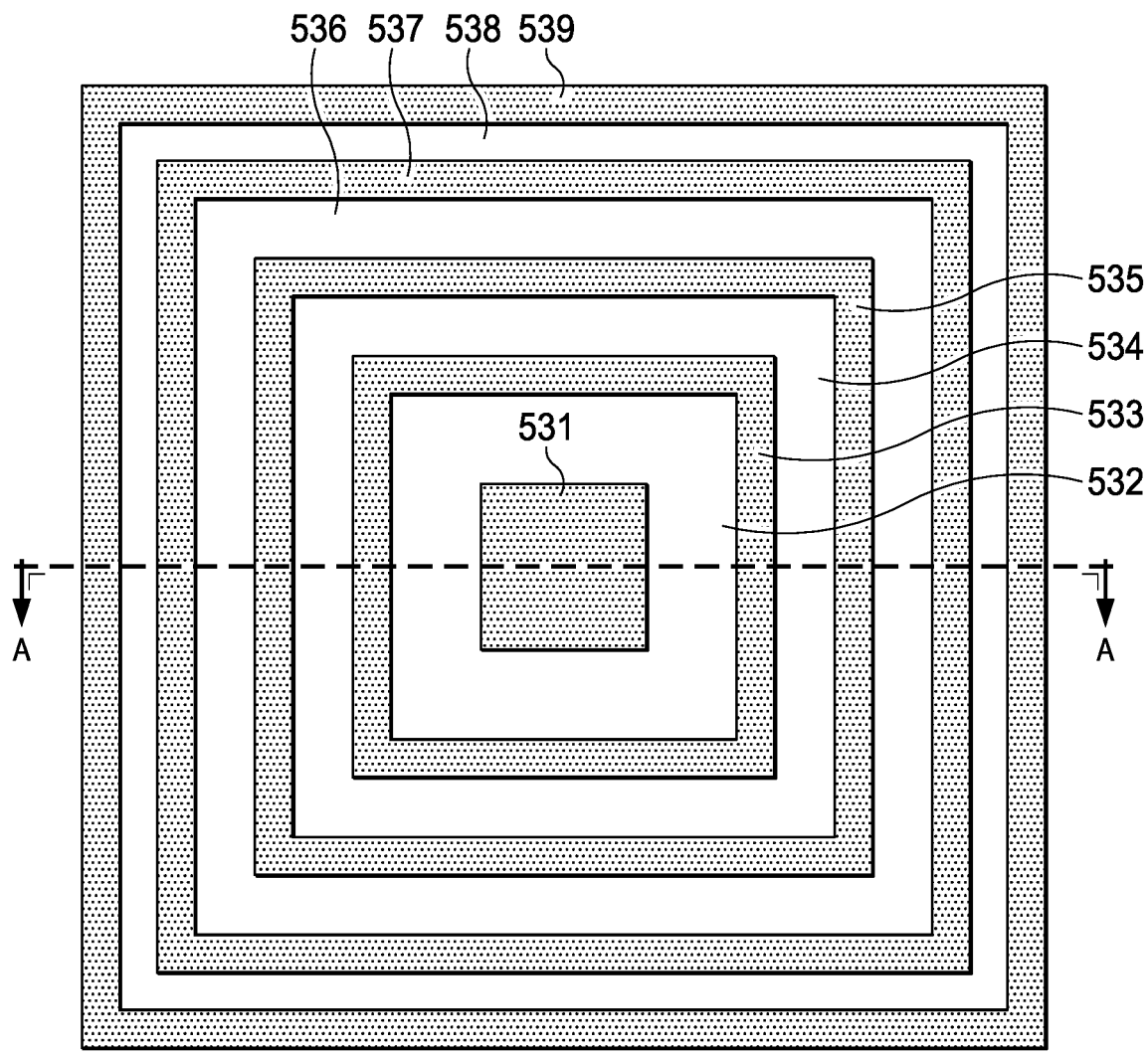
FIG. 5 shows a top view of an exemplary Fresnel structure with a rectangular ring pattern according to an aspect of the present disclosure.

FIG. 5 shows a top view of an exemplary Fresnel structure with a rectangular ring 500 pattern according to an aspect of the present disclosure. The rectangular ring pattern 500 is parallel to a top surface of the integrated circuit substrate (e.g., 102). The rectangular ring pattern 500 includes: a rectangular center plate 531 overlaps with the central region (e.g., 131 and 171) of the Fresnel structure; a first rectangular ring plate 531 surrounding the rectangular center plate 531; a second rectangular ring plate 533 concentric with the first rectangular ring plate 531; a third rectangular ring plate 535 concentric with the second rectangular ring plate 533; a fourth rectangular ring plate 537 concentric with the third rectangular ring plate 535; and a fifth rectangular ring plate 539 concentric with the fourth rectangular ring plate 537.

Together, the rectangular center plate 531 and the rectangular ring plates 533, 535, 537, and 539 define several rectangular ring slits, including: a first rectangular ring slit 532 defined between the rectangular center plate 531 and the first rectangular ring plate 533; a second rectangular ring slit 534 defined between the second rectangular ring plate 533 and the second rectangular ring plate 535; a third rectangular ring slit 536 defined between the third rectangular ring plate 535 and the fourth rectangular ring plate 537; and a fourth rectangular ring slit 538 defined between the fourth rectangular ring plate 537 and the fifth rectangular ring plate 539.

According to an aspect of the present disclosure, the cross-section A of the rectangular ring pattern 500 can be viewed as the cross-sectional view of the Fresnel structure 120 as shown and described in FIGS. 1A-1C. Thus, the rectangular ring slits 532, 534, 536, and 538 may correspond to the trenches 132, 134, 136, and 138 respectively. To that end, each of the trenches 132, 134, 136, and 138 is a rectangular ring trench adopting the planar configuration of the rectangular ring pattern 500. Moreover, the rectangular ring plates 533, 535, 537, and 539 may correspond to the moat regions 153, 135, 137, and 139 respectively. To that end, each of the moat regions 153, 135, 137, and 139 is a rectangular moat ring adopting the planar configuration of the rectangular ring pattern 500.

According to another aspect of the present disclosure, the cross-section A of the rectangular ring pattern 500 can be viewed as the cross-sectional view of the Fresnel structure 160 as shown and described in FIG. 1D. Thus, the rectangular ring slits 532, 534, 536, and 538 may correspond to the slits 172, 174, 176, and 178 respectively. To that end, each of the slits 172, 174, 176, and 178 is a rectangular ring slit adopting the planar configuration of the rectangular ring pattern 500. Moreover, the rectangular ring plates 533, 535, 537, and 539 may correspond to the zone plates 173, 175, 177, and 179 respectively. To that end, each of the zone plates 173, 175, 177, and 179 is a rectangular ring plate adopting the planar configuration of the rectangular ring pattern 500.

Figure 6:
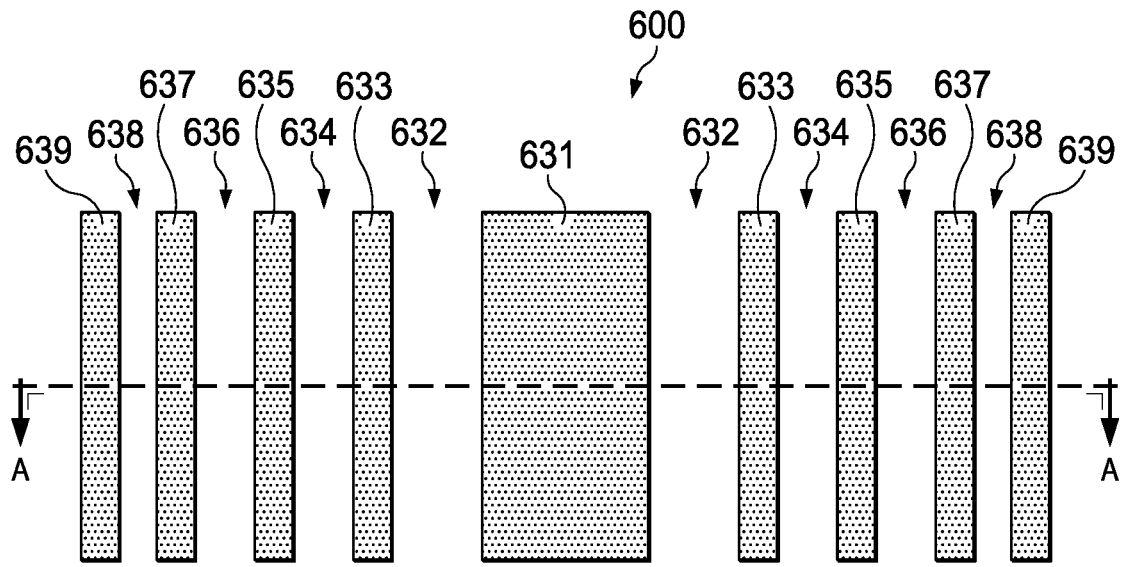
FIG. 6 shows a top view of an exemplary Fresnel structure with a linear pattern according to an aspect of the present disclosure.

FIG. 6 shows a top view of an exemplary Fresnel structure with a linear pattern 600 according to an aspect of the present disclosure. The linear pattern 600 is parallel to a top surface of the integrated circuit substrate (e.g., 102). The linear pattern 600 includes: a rectangular center plate 631 overlaps with the central region (e.g., 131 and 171) of the Fresnel structure; a first rectangular strip plate 631 surrounding the rectangular center plate 631; a second rectangular strip plate 633 concentric with the first rectangular strip plate 631; a third rectangular strip plate 635 concentric with the second rectangular strip plate 633; a fourth rectangular strip plate 637 concentric with the third rectangular strip plate 635; and a fifth rectangular strip plate 639 concentric with the fourth rectangular strip plate 637.

Together, the rectangular center plate 631 and the rectangular strip plates 633, 635, 637, and 639 define several rectangular strip slits, including: a first rectangular strip slit 632 defined between the rectangular center plate 631 and the first rectangular strip plate 633; a second rectangular strip slit 634 defined between the second rectangular strip plate 633 and the second rectangular strip plate 635; a third rectangular strip slit 636 defined between the third rectangular strip plate 635 and the fourth rectangular strip plate 637; and a fourth rectangular strip slit 638 defined between the fourth rectangular strip plate 637 and the fifth rectangular strip plate 639.

According to an aspect of the present disclosure, the cross-section A of the linear pattern 600 can be viewed as the cross-sectional view of the Fresnel structure 120 as shown and described in FIGS. 1A-1C. Thus, the rectangular strip slits 632, 634, 636, and 638 may correspond to the trenches 132, 134, 136, and 138 respectively. To that end, each of the trenches 132, 134, 136, and 138 is a rectangular strip trench adopting the planar configuration of the rectangular strip pattern 600. Moreover, the rectangular strip plates 633, 635, 637, and 639 may correspond to the moat regions 163, 135, 137, and 139 respectively. To that end, each of the moat regions 163, 135, 137, and 139 is a rectangular moat strip adopting the planar configuration of the rectangular strip pattern 600.

According to another aspect of the present disclosure, the cross-section A of the linear pattern 600 can be viewed as the cross-sectional view of the Fresnel structure 160 as shown and described in FIG. 1D. Thus, the rectangular strip slits 632, 634, 636, and 638 may correspond to the slits 172, 174, 176, and 178 respectively. To that end, each of the slits 172, 174, 176, and 178 is a rectangular strip slit adopting the planar configuration of the rectangular strip pattern 600. Moreover, the rectangular strip plates 633, 635, 637, and 639 may correspond to the zone plates 173, 175, 177, and 179 respectively. To that end, each of the zone plates 173, 175, 177, and 179 is a rectangular strip plate adopting the planar configuration of the rectangular strip pattern 600.

Consistent with the present disclosure, the term "configured to" purports to describe the structural and functional characteristics of one or more tangible non-transitory components. For example, the term "configured to" can be understood as having a particular configuration that is designed or dedicated for performing a certain function.

Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Moreover, the term "exemplary" is used herein to mean serving as an example, instance, illustration, etc., and not necessarily as advantageous. Also, although the disclosure has been shown and described with respect to one or more implementations, equivalent alterations and modifications will be apparent upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. An integrated circuit, comprising:
a substrate;
a photodiode formed on the substrate, the photodiode having a p-n junction and having a first-side edge, a second-side edge and a bottom edge; and
a trench structure formed above the photodiode, the trench structure defining a focal zone positioned within a proximity of the p-n junction, the trench structure having:
a central region positioned directly above the first-side edge of the photodiode;
a first trench adjacent to a first-side of the central region; and
a secondary trench adjacent to a second-side of the central region, the first-side is opposite to the second-side, and a width of the first trench is equal to a width of the secondary trench.

2. The integrated circuit of claim 1, wherein the trench structure further including:
a second trench positioned adjacent to the central region of the trench structure by a third radial distance, the second trench having a width based on a second difference between a fourth radial distance and the third radial distance, and wherein the first trench positioned adjacent to the central region of the trench structure by a first radial distance, the width of the first trench is based on a first difference between a second radial distance and the first radial distance.

3. The integrated circuit of claim 2, wherein:
the first radial distance is based on a focal length defined by the focal zone, a first multiplier, and a wavelength of an electromagnetic (EM) wave to be detected by the photodiode;
the second radial distance is based on the focal length, a second multiplier greater than the first multiplier, and the wavelength of the EM wave to be detected by the photodiode;
the third radial distance is based on the focal length, a third multiplier greater than the second multiplier, and the wavelength of the EM wave to be detected by the photodiode; and
the fourth radial distance is based on the focal length, a fourth multiplier greater than the third multiplier, and the wavelength of the EM wave to be detected by the photodiode.

4. The integrated circuit of claim 2, wherein:
the first trench includes a first ring trench parallel to a top surface of the substrate and laterally surrounding the central region of the trench structure; and
the second trench includes a second ring trench parallel to the top surface of the substrate and laterally surrounding the first ring trench.

5. The integrated circuit of claim 4, wherein:
the first ring trench includes a first circular ring trench having a center overlapping with the central region of the trench structure; and
the second ring trench includes a second circular ring trench concentric with the first circular ring trench.

6. The integrated circuit of claim 4, wherein:
the first ring trench includes a first octagonal ring trench having a center overlapping with the central region of the trench structure; and
the second ring trench includes a second octagonal ring trench concentric with the first octagonal ring trench.

7. The integrated circuit of claim 4, wherein:
the first ring trench includes a first rectangular ring trench having a center overlapping with the central region of the trench structure; and
the second ring trench includes a second rectangular ring trench concentric with the first rectangular ring trench.

8. The integrated circuit of claim 2, wherein:
the first trench includes a first pair of parallel trenches placed on opposite sides of the central region of the trench structure; and
the second trench includes a second pair of parallel trenches bracketing the first pair of parallel trenches.

9. The integrated circuit of claim 2, wherein:
the first trench is etched into a top surface of the substrate; and
the second trench is etched into the top surface of the substrate.

10. The integrated circuit of claim 2, wherein:
the first trench is etched into an epitaxial layer grown above the substrate; and
the second trench is etched into the epitaxial layer grown above the substrate.

11. The integrated circuit of claim 2, wherein the trench structure includes:
a first transparent dielectric structure occupying the first trench; and
a second transparent dielectric structure occupying the second trench.

12. An integrated circuit, comprising:
a substrate;
a photodiode formed on the substrate, the photodiode having a p-n junction; and
a trench structure formed above the photodiode, the trench structure defining a focal zone positioned within a proximity of the p-n junction, the trench structure includes a wiring pattern formed above the photodiode, the wiring pattern including:
a first zone plate formed in a wiring layer above the substrate, the first zone plate positioned adjacent to a central region of the trench structure by a first radial distance, the first zone plate having a first width based on a first difference between a second radial distance and the first radial distance; and
a second zone plate formed in the wiring layer and positioned adjacent to the central region of the trench structure by a third radial distance, the second zone plate having a second width based on a second difference between a fourth radial distance and the third radial distance, wherein each of the first, second, third and fourth radial distances is based on a focal length defined by the focal zone and a wavelength of an electromagnetic (EM) wave to be detected by the photodiode.

13. The integrated circuit of claim 12, wherein the wiring layer includes a polysilicon layer formed on a dielectric layer above the substrate.

14. The integrated circuit of claim 12, wherein the wiring layer includes a metal layer formed on a dielectric layer above the substrate.

15. The integrated circuit of claim 12, wherein:
the first radial distance is based on the focal length defined by the focal zone, a first multiplier, and a wavelength of the electromagnetic (EM) wave to be detected by the photodiode;
the second radial distance is based on the focal length, a second multiplier greater than the first multiplier, and the wavelength of the EM wave to be detected by the photodiode;
the third radial distance is based on the focal length, a third multiplier greater than the second multiplier, and the wavelength of the EM wave to be detected by the photodiode; and
the fourth radial distance is based on the focal length, a fourth multiplier greater than the third multiplier, and the wavelength of the EM wave to be detected by the photodiode.

16. The integrated circuit of claim 12, wherein:
the first zone plate includes a first ring plate parallel to a top surface of the substrate and laterally surrounding the central region of the trench structure; and
the second zone plate includes a second ring plate parallel to the top surface of the substrate and laterally surrounding the first ring plate.

17. The integrated circuit of claim 16, wherein:
the first ring plate includes a first circular ring plate having a center overlapping with the central region of the trench structure; and
the second ring plate includes a second circular ring plate concentric with the first circular ring plate.

18. The integrated circuit of claim 16, wherein:
the first ring plate includes a first octagonal ring plate having a center overlapping with the central region of the trench structure; and
the second ring plate includes a second octagonal ring plate concentric with the first octagonal ring plate.

19. The integrated circuit of claim 16, wherein:
the first ring plate includes a first rectangular ring plate having a center overlapping with the central region of the trench structure; and
the second ring plate includes a second rectangular ring plate concentric with the first rectangular ring plate.

20. The integrated circuit of claim 16, wherein:
the first zone plate includes a first pair of parallel plates placed on opposite sides of the central region of the trench structure; and
the second zone plate includes a second pair of parallel plates bracketing the first pair of parallel plates.

21. An integrated circuit, comprising:
a substrate;
a top surface positioned above the substrate;
a photodiode formed on the substrate, the photodiode having a p-n junction and having a first-side edge, a second-side edge and a bottom edge; and
a slit structure formed above the photodiode and beneath the top surface, the slit structure defining a focal zone within a proximity of the p-n junction, the slit structure having:
a central region positioned directly above the first-side edge of the photodiode;
a first slit adjacent to a first-side of the central region; and
a secondary slit adjacent to a second-side of the central region, the first-side is opposite to the second-side, and a width of the first slit is equal to a width of the secondary slit.

22. The integrated circuit of claim 21, wherein the slit structure further including:
a second slit positioned adjacent to the central region of the slit structure by a third radial distance, the second slit having a width based on a second difference between a fourth radial distance and the third radial distance, and wherein the first slit positioned adjacent to the central region of the slit structure by a first radial distance, the width of the first slit is based on a first difference between a second radial distance and the first radial distance.

23. The integrated circuit of claim 22, wherein:
the first radial distance is based on a focal length defined by the focal zone, a first multiplier, and a wavelength of an electromagnetic (EM) wave;
the second radial distance is based on the focal length, a second multiplier greater than the first multiplier, and the wavelength of the EM wave;
the third radial distance is based on the focal length, a third multiplier greater than the second multiplier, and the wavelength of the EM wave; and
the fourth radial distance is based on the focal length, a fourth multiplier greater than the third multiplier, and the wavelength of the EM wave.

24. The integrated circuit of claim 22, wherein:
the first slit includes a first ring slit parallel to the top surface and laterally surrounding the central region of the slit structure; and
the second slit includes a second ring slit parallel to the top surface and laterally surrounding the first ring slit.

25. The integrated circuit of claim 24, wherein:
the first ring slit includes a first circular ring slit having a center overlapping with the central region of the slit structure; and
the second ring slit includes a second circular ring slit concentric with the first circular ring slit.

26. The integrated circuit of claim 24, wherein:
the first ring slit includes a first octagonal ring slit having a center overlapping with the central region of the slit structure; and
the second ring slit includes a second octagonal ring slit concentric with the first octagonal ring slit.

27. The integrated circuit of claim 24, wherein:
the first ring slit includes a first rectangular ring slit having a center overlapping with the central region of the slit structure; and
the second ring slit includes a second rectangular ring slit concentric with the first rectangular ring slit.

28. The integrated circuit of claim 22, wherein:
the first slit includes a first pair of parallel slits placed on opposite sides of the central region of the slit structure; and
the second slit includes a second pair of parallel slits bracketing the first pair of parallel slits.

29. The integrated circuit of claim 21, wherein the slit structure includes shallow trenches etched into a top epitaxial layer grown above the substrate.

30. The integrated circuit of claim 21, wherein the slit structure includes wire gratings formed in an interconnect layer.

* * * * *